United States Patent
Kato et al.

(10) Patent No.: US 9,177,696 B2
(45) Date of Patent: Nov. 3, 2015

(54) FLAT CABLE

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 16 days.

(21) Appl. No.: 14/312,797

(22) Filed: Jun. 24, 2014

(65) Prior Publication Data

US 2014/0299374 A1    Oct. 9, 2014

Related U.S. Application Data

(63) Continuation of application No. PCT/JP2013/067595, filed on Jun. 27, 2013.

(30) Foreign Application Priority Data

Jun. 29, 2012   (JP) .................................. 2012-147864

(51) Int. Cl.
*H05K 1/00*   (2006.01)
*H01B 7/08*   (2006.01)
(Continued)

(52) U.S. Cl.
CPC *H01B 7/08* (2013.01); *H01P 3/085* (2013.01); *H01P 5/028* (2013.01); *H05K 1/0221* (2013.01); *H05K 1/028* (2013.01); *H05K 1/147* (2013.01)

(58) Field of Classification Search
CPC .............. H01B 7/08; H01P 3/06; H01P 3/085; H01P 3/088; H05K 1/0253; H05K 2201/0191

USPC .......... 174/250, 251, 255, 254, 110 R, 113 R, 174/117 R, 117 F, 117 FF, 36

See application file for complete search history.

(56) References Cited

U.S. PATENT DOCUMENTS 7,940,144 B2 *  5/2011  Koch ........................ H01P 3/08
                                                    333/238
8,810,340 B2 *  8/2014  Kato ........................ H01P 3/00
                                                    333/238

(Continued)

FOREIGN PATENT DOCUMENTS

JP    2001-016007 A    1/2001
JP    2007-123740 A    5/2007

(Continued)

OTHER PUBLICATIONS

Official Communication issued in International Patent Application No. PCT/JP2013/067595, mailed on Aug. 20, 2013.

*Primary Examiner* — William H Mayo, III
(74) *Attorney, Agent, or Firm* — Keating & Bennett, LLP

(57) ABSTRACT

A flat cable includes a base material including a signal conductor extending in a first direction, a first ground conductor, and a second ground conductor. The second ground conductor includes elongated conductors extending in the first direction, and bridge conductors that connect the elongated conductors at predetermined spacings along the first direction. The second ground conductor is connected with via-hole conductors at predetermined positions in two mutually opposite directions along the first direction with respect to each of the bridge conductors. Countercurrents generated from a plurality of countercurrent generation points do not flow to the first ground conductor via a common via-hole but flow to the first ground conductor individually via separate via-hole conductors.

20 Claims, 14 Drawing Sheets

(51) Int. Cl.
*H01P 3/08* (2006.01)
*H05K 1/02* (2006.01)
*H01P 5/02* (2006.01)
*H05K 1/14* (2006.01)

(56) References Cited

U.S. PATENT DOCUMENTS 8,957,325 B2 * 2/2015 Hidaka ............... H05K 1/116
 174/262
2012/0097433 A1 4/2012 Kato et al.
2012/0274423 A1 * 11/2012 Kato ............... H01P 1/20363
 333/238
2013/0127560 A1 5/2013 Kato et al.
2013/0147581 A1 6/2013 Kato et al.
2014/0003007 A1 * 1/2014 Shiroki ............... H01B 7/08
 361/752

FOREIGN PATENT DOCUMENTS

| | | |
|---|---|---|
| JP | 2007-281145 A | 10/2007 |
| JP | 3173143 U | 1/2012 |
| WO | 2011/007660 A1 | 1/2011 |
| WO | 2012/073591 A1 | 6/2012 |
| WO | 2012/074100 A1 | 6/2012 |
| WO | 2012/074101 A1 | 6/2012 |

* cited by examiner

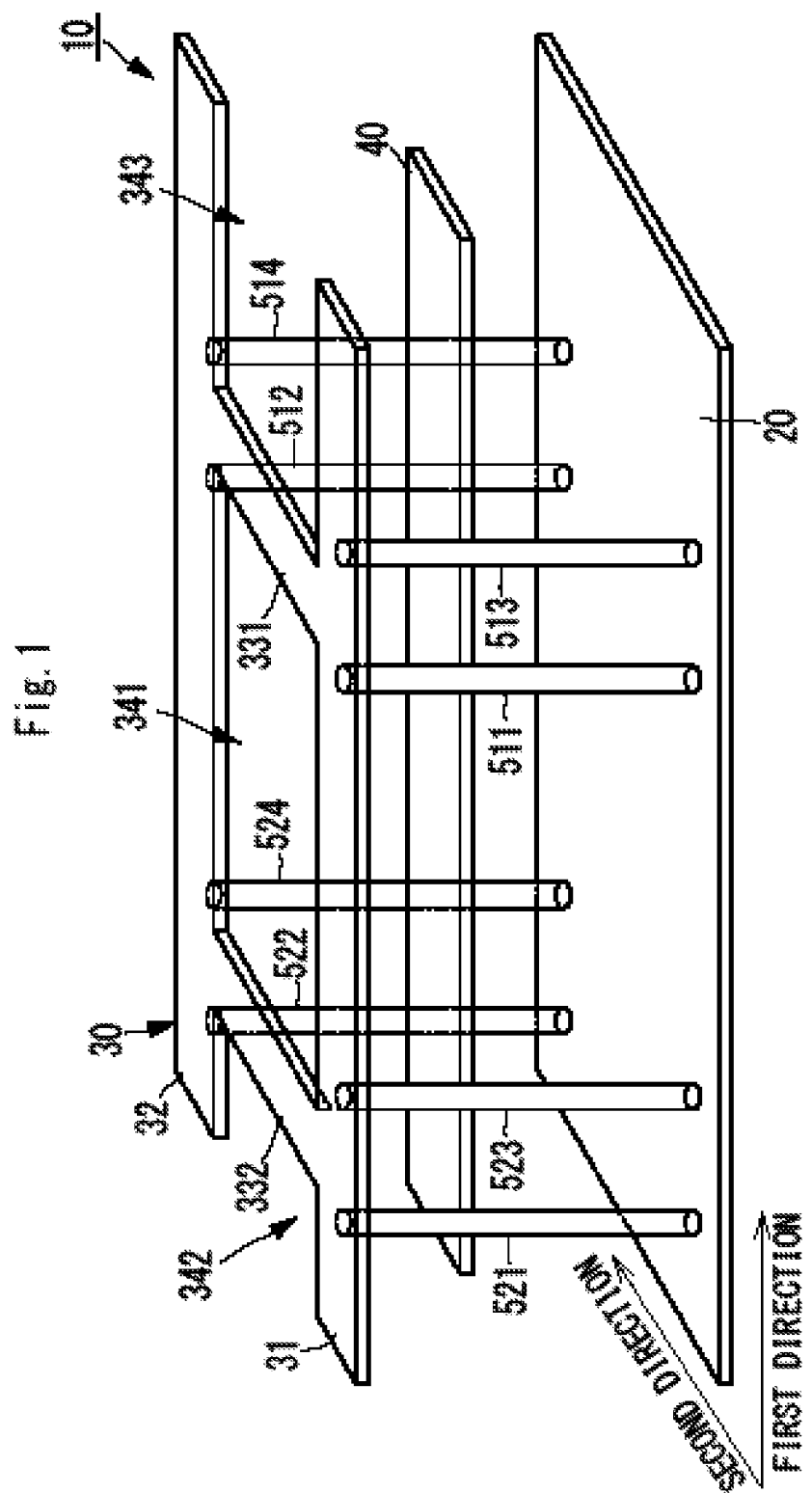

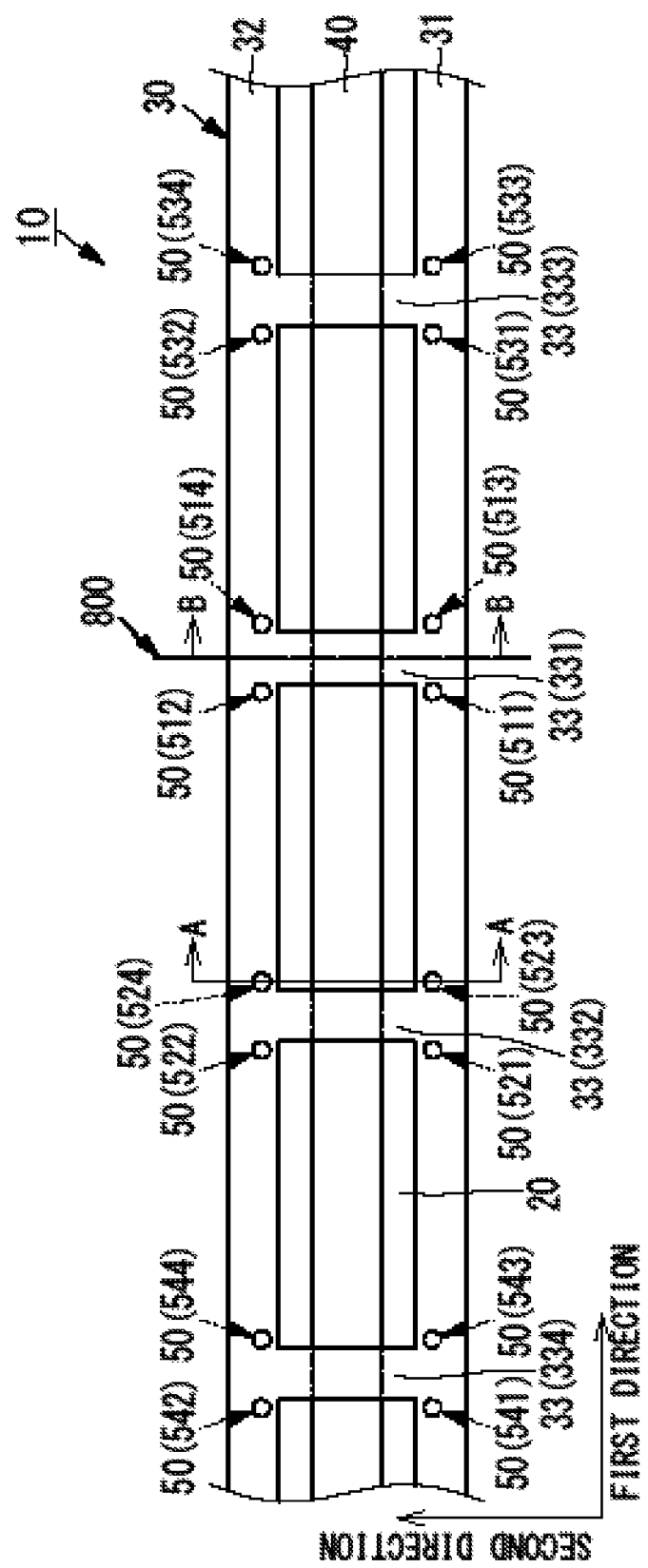

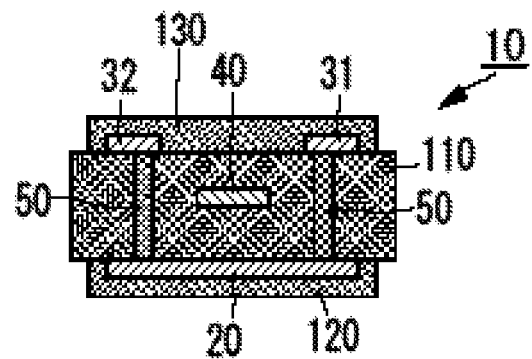
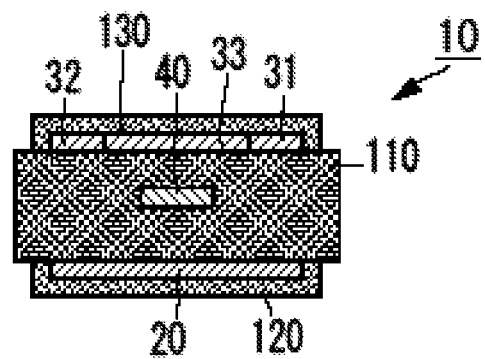

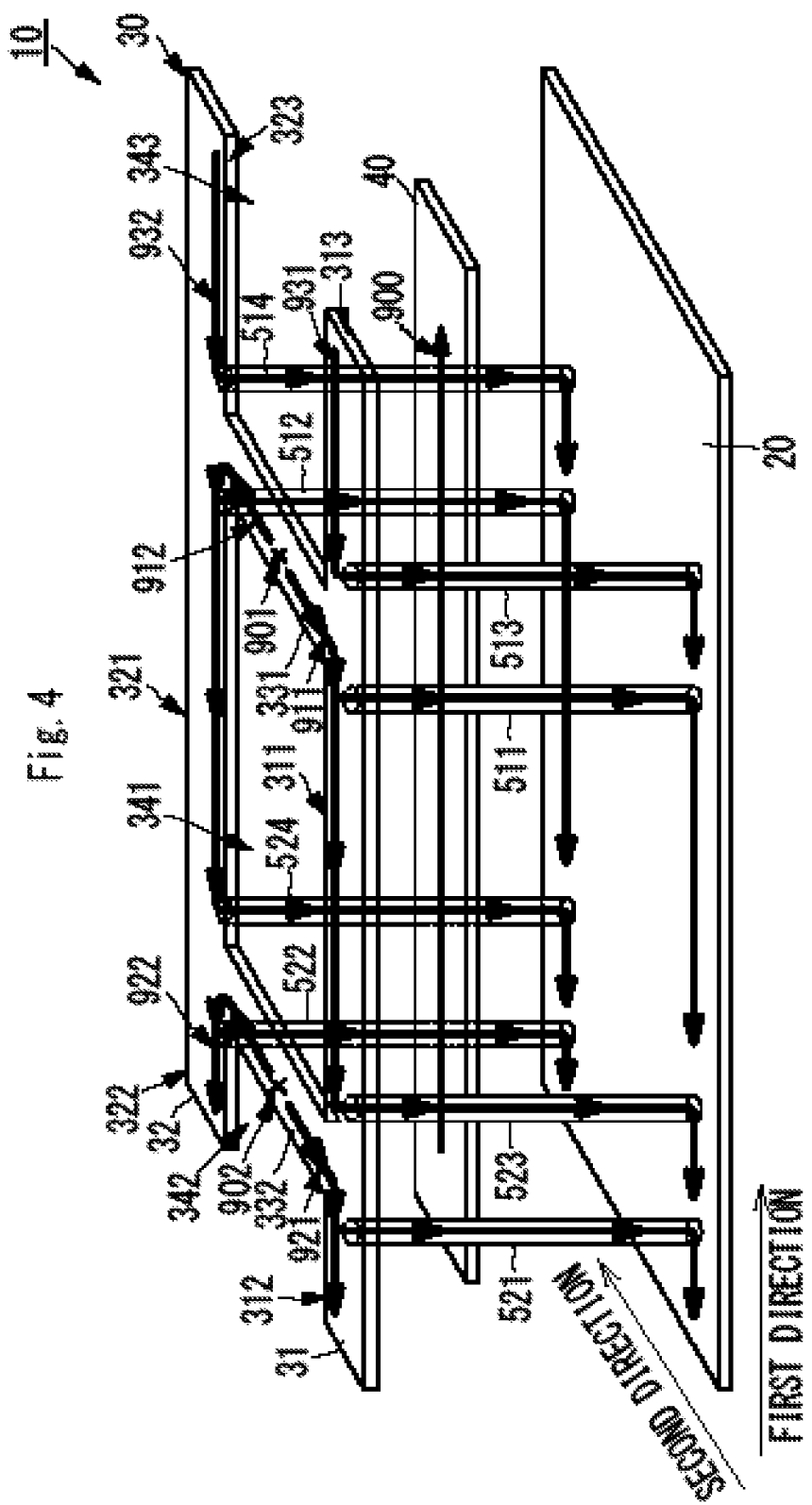

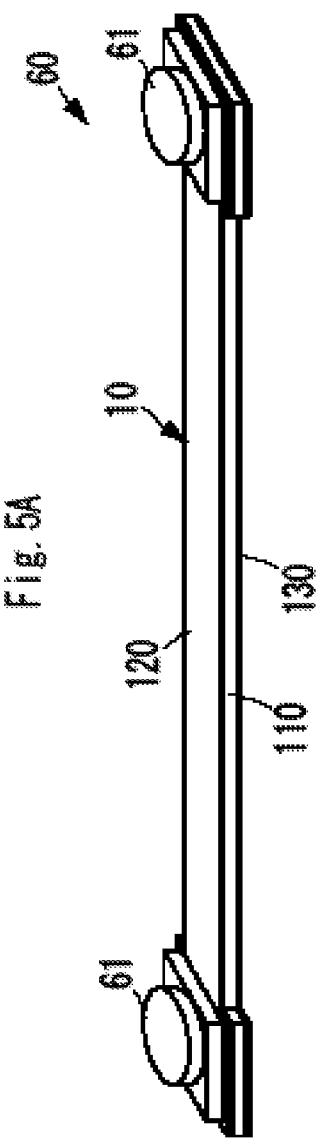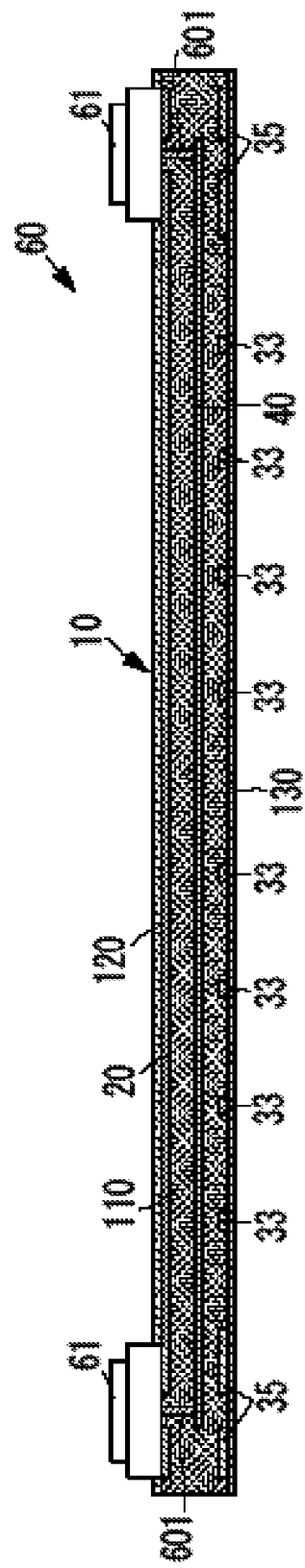

FLAT CABLE

CROSS-REFERENCE TO RELATED APPLICATIONS

This application is a continuation application of PCT/JP2013/067595 filed Jun. 27, 2013, the contents of which are hereby incorporated by reference, which claims priority to Japanese patent application 2012-147864, the contents of which are hereby incorporated by reference.

BACKGROUND OF THE INVENTION

[1.] Field of the Invention

The present invention relates to a thin flat cable configured to transmit radio frequency signals.

[2.] Description of Related Art

Conventionally, a coaxial cable is a typical example of a radio frequency line for transmitting radio frequency signals. A coaxial cable includes a central conductor (signal conductor) shaped to extend in one direction (shaped to extend in the direction of signal transmission), and a shield conductor provided concentrically along the outer peripheral surface of the signal conductor.

Incidentally, as radio frequency devices including mobile communications terminals have become increasingly smaller and thinner in recent years, it is not possible to secure a space for disposing a coaxial cable inside the terminal housing in some cases.

Accordingly, attention is being given to use of a flat cable as discussed in each of International Publication No. WO 2011/007660 and Japanese Registered Utility Model No. 3173143 for such a terminal housing. Although a flat cable has a larger width than a coaxial cable, a flat cable can be reduced in thickness, which proves particularly advantageous for cases such as when there is only a small gap inside the terminal housing.

The flat cable discussed in each of International Publication No. WO 2011/007660 and Japanese Registered Utility Model No. 3173143 has a triplate strip line structure as its basic structure.

FIG. 13 is an exploded perspective view illustrating a structure of the flat cable discussed in International Publication No. WO 2011/007660. In FIG. 13, the base material of the flat cable is omitted, and only the structure of conductors is depicted.

A conventional flat cable 10P includes a first ground conductor 20, a second ground conductor 30, a signal conductor 40, and a base material (not illustrated). The first ground conductor 20, the second ground conductor 30, and the signal conductor 40 are flat film conductors having an elongated shape extending in a first direction that is the direction of signal transmission.

The first ground conductor 20, the second ground conductor 30, and the signal conductor 40 are disposed at a predetermined distance in a direction orthogonal to their respective flat film surfaces, so that these flat plate surfaces become parallel to one another.

The signal conductor 40 is disposed between the first ground conductor 20 and the second ground conductor 30.

The second ground conductor 30 includes an elongated conductor 31 and an elongated conductor 32 which extend in the first direction. The elongated conductor 31 and the elongated conductor 32 are spaced apart along a second direction that is orthogonal to the first direction. As viewed in a direction orthogonal to their flat film surfaces, the elongated conductor 31 and the elongated conductor 32 are disposed so as to sandwich the signal conductor 40, without overlapping the signal conductor 40.

The elongated conductor 31 and the elongated conductor 32 are partially connected by a plurality of bridge conductors that are shaped to extend along the second direction. The plurality of bridge conductors 33 are disposed at predetermined spacings along the first direction. As a result, the second conductor 30 has a ladder-like configuration with a plurality of openings 341, 342, and 343 provided along the first direction.

The second ground conductor 30 and the first ground conductor 20 are connected by a plurality of via-hole conductors 511P, 512P, 521P, and 522P.

The plurality of via-hole conductors 511P, 512P, 521P, and 522P are formed in areas of the elongated conductor 31 and elongated conductor 32 which connect with each of the bridge conductors 33. More precisely, each of the plurality of via-hole conductors 511P, 512P, 521P, and 522P is disposed at the center position in the width direction (direction parallel to the first direction) of the corresponding bridge conductor 33.

However, the flat cable disclosed in each of International Publication No. WO 2011/007660 and Japanese Registered Utility Model No. 3173143 which has the structure illustrated in FIG. 13 has problems described below. FIG. 14 is an exploded perspective view for explaining problems of the conventional flat cable 10P.

In the conventional flat cable 10P, it is the portion of the bridge conductors 33 (331 and 332) whose flat film surface is opposed to the second ground conductor 30 and the signal conductor 40.

Therefore, when transmission of a radio frequency signal causes a current to flow through the signal conductor 40, countercurrents 911, 912, 921, and 922 are generated with the bridge conductors 331 and 332 as countercurrent generation points 901 and 902, respectively.

The countercurrent 911 flows from the bridge conductor 331 to the elongated conductor 31, with the countercurrent generation point 901 of the bridge conductor 331 as a starting point.

The countercurrent 911 flows to the first ground conductor 20 via the via-hole conductor 511P located in close proximity to the bridge conductor 331. The countercurrent 911 also flows to the first ground conductor 20 via an area 311 of the elongated conductor 31 which is located between the bridge conductors 331 and 332, and the via-hole conductor 521P located in close proximity to the bridge conductor 332.

The countercurrent 921 flows from the bridge conductor 332 to the elongated conductor 31, with the countercurrent generation point 902 of the bridge conductor 332 as a starting point.

The countercurrent 921 flows to the first ground conductor 20 via the via-hole conductor 512P located in close proximity to the bridge conductor 332. The countercurrent 921 also flows to the first ground conductor 20 via an area 312 of the elongated conductor 31 which is located between the bridge conductors 332 and another bridge conductor, and a via-hole conductor located in close proximity to the other bridge conductor.

In this way, in the conventional flat cable 10P, the countercurrents 911 and 921 generated from different countercurrent generation points 901 and 902, respectively, concentrate on the via-hole conductor 521P. Although not described in detail, such current concentration also occurs for the other via-hole conductor provided to the elongated conductor 31.

The countercurrent 912 flows from the bridge conductor 331 to the elongated conductor 32, with the countercurrent generation point 901 of the bridge conductor 331 as a starting point.

The countercurrent 912 flows to the first ground conductor 20 via the via-hole conductor 512P located in close proximity to the bridge conductor 331. The countercurrent 912 also flows to the first ground conductor 20 via an area 321 of the elongated conductor 32 which is located between the bridge conductors 331 and 332, and the via-hole conductor 522P located in close proximity to the bridge conductor 332.

The countercurrent 922 flows from the bridge conductor 332 to the elongated conductor 32, with the countercurrent generation point 902 of the bridge conductor 332 as a starting point.

The countercurrent 922 flows to the first ground conductor 20 via the via-hole conductor 522P located in close proximity to the bridge conductor 332. The countercurrent 922 also flows to the first ground conductor 20 via an area 322 of the elongated conductor 32 which is located between the bridge conductors 332 and another bridge conductor, and a via-hole conductor located in close proximity to the other bridge conductor.

In this way, in the conventional flat cable 10P, the countercurrents 912 and 922 generated from different countercurrent generation points 901 and 902, respectively, concentrate on the via-hole conductor 522P. Although not described in detail, such current concentration occurs likewise for the other via-hole conductor provided to the elongated conductor 32.

As described above, in the conventional flat cable 10P, countercurrents generated in the second ground conductor 30 concentrate on a via-hole conductor. This makes current density higher in the neighborhood of the via-hole conductor, causing a localized increase in resistance in the vicinity of the via-hole conductor. Consequently, a potential difference develops between the second ground conductor 30 and the first ground conductor 20, causing unwanted resonance. Therefore, the transmission characteristics of the flat cable 10P as a radio frequency line deteriorate. In particular, as compared with the bridge conductor 332, via-hole conductors have high resistivity and do not readily allow current to flow through. If currents flowing through bridge conductors concentrate on a via-hole conductor, the resistance encountered when countercurrents flow becomes high, leading to an increase in the transmission loss of the transmission line as a whole.

SUMMARY OF THE INVENTION

Accordingly, preferred embodiments of the present invention provide a flat cable having a structure with which the transmission characteristics of the flat cable as a radio frequency line do not deteriorate.

A flat cable according to a preferred embodiment of the present invention includes a base material, a signal conductor, first and second ground conductors, and an interlayer connection conductor. The base material has flexibility. The signal conductor is provided inside the base material, and shaped to extend in a first direction. The first and second ground conductors are shaped to extend along the signal conductor, and are disposed so as to sandwich the base material from both sides of the thickness direction of the base material. The interlayer connection conductor is provided in the base material so as to connect the first ground conductor and the second ground conductor. The second ground conductor includes two elongated conductors that are shaped to extend in parallel or substantially in parallel along the first direction at a spacing from each other, and bridge conductors that connect the two elongated conductors at predetermined spacings along the first direction. The interlayer connection conductor includes a first interlayer connection conductor and a second interlayer connection conductor. The first interlayer connection conductor and the second interlayer connection conductor are configured so as to sandwich a connecting position of each of the elongated conductors with each of the bridge conductors along the first direction.

According to this configuration, when countercurrents are generated in the second ground conductor with the individual bridge conductors as countercurrent generation points, the interlayer connection conductor that guides countercurrent mainly to the first ground conductor is made to differ for each of the countercurrents generated from the respective points. As a result, the countercurrents flow to the first ground conductor in a dispersed fashion, thus significantly reducing or preventing current concentration near the interlayer connection conductor.

In the flat cable according to a preferred embodiment of the present invention, the first interlayer connection conductor and the second interlayer connection conductor are preferably disposed at symmetrical positions with respect to a center line of each of the bridge conductors which passes through the connecting position.

This configuration specifies a specific implementation of the first interlayer connection conductor and the second interlayer connection conductor. This configuration allows for easy design of the first interlayer connection conductor and the second interlayer connection conductor, and makes the countercurrent distribution periodic and uniform along the first direction.

In the flat cable according to a preferred embodiment of the present invention, preferably, each of the first interlayer connection conductor and the second interlayer connection conductor is located near or adjacent to a corner portion where each of the elongated conductors and each of the bridge conductors connect with each other.

According to this configuration, the first interlayer connection conductor and the second interlayer connection conductor are disposed on a path through which countercurrent mainly flows. Therefore, countercurrents are effectively guided to the first ground conductor.

The flat cable according to according to a preferred embodiment of the present invention is preferably configured as follows. The elongated conductors are shaped to increase in width so that a distance between the elongated conductors becomes shorter with increasing proximity to a connecting position with each of the bridge conductors. Each of the first interlayer connection conductor and the second interlayer connection conductor is configured so as to at least partially lie within a portion of increased width of each of the elongated conductors.

This configuration specifies a more preferred embodiment of the first interlayer connection conductor and the second interlayer connection conductor. According to this configuration, countercurrents are effectively guided to the first ground conductor without causing current concentration on each of the interlayer connection conductors.

Preferably, the signal conductor of the flat cable according to a preferred embodiment of the present invention has a larger width in an area that does not overlap each of the bridge conductors than in an area that overlaps each of the bridge conductors.

According to this configuration, the radio frequency resistance of the signal conductor is significantly reduced.

Preferably, the bridge conductors of the flat cable according to a preferred embodiment of the present invention are provided at spacings that vary at least partially along the first direction.

According to this configuration, even in the presence of unwanted resonance that cannot be completely suppressed, the frequency of unwanted resonance varies with the spacing of the bridge conductors, thus ensuring that the transmission characteristics of the flat cable as a radio frequency line are not affected.

According to various preferred embodiments of the present invention, it is possible to realize a flat cable that has excellent transmission characteristics as a radio frequency line.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an exploded perspective view illustrating a structure of a flat cable according to a first preferred embodiment of the present invention.

FIG. 2 is a plan view illustrating a structure of the flat cable according to the first preferred embodiment of the present invention.

FIGS. 3A and 3B illustrate cross-sections along A-A and B-B of the flat cable according to the first preferred embodiment of the present invention.

FIG. 4 illustrates transmission paths of countercurrents in the flat cable 10 according to the first preferred embodiment of the present invention.

FIGS. 5A and 5B are an exterior perspective view and a cross-sectional view of a connector cable according to the first preferred embodiment of the present invention.

DETAILED DESCRIPTION OF THE PREFERRED EMBODIMENTS

Figure 6A:
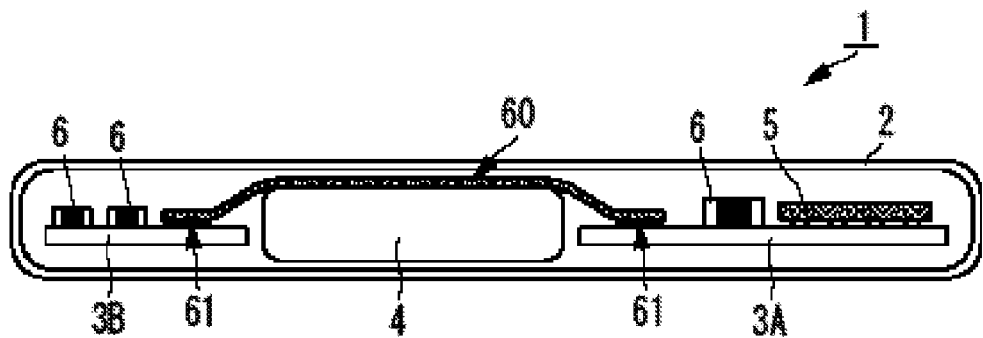
FIGS. 6A and 6B are a side cross-sectional view and a plan cross-sectional view, each illustrating a configuration of the components of a portable electronic device according to the first preferred embodiment of the present invention.

A flat cable according to a first preferred embodiment of the present invention will be described with reference to the figures. FIG. 1 is an exploded perspective view illustrating a structure of the flat cable according to the first preferred embodiment of the present invention. FIG. 2 is a plan view illustrating a structure of the flat cable according to the first preferred embodiment of the present invention. In FIGS. 1 and 2, the base material of the flat cable is not illustrated, and only the structure of conductors is illustrated. FIGS. 3A and 3B are cross-sectional views of the flat cable according to the first preferred embodiment of the present invention. FIG. 3A illustrates a cross-section along A-A of FIG. 2, and FIG. 3B illustrates a cross-section along B-B of FIG. 2.

The flat cable 10 includes a first ground conductor 20, a second ground conductor 30, a signal conductor 40, and a base material 110. The base material 110 is made from a flexible material having insulating property such as polyimide or liquid crystal polymer. The first conductor 20, the second ground conductor 30, and the signal conductor 40 are made of a material with high electrical conductivity, for example, copper (Cu).

The signal conductor 40 is a flat film conductor that has an elongated shape extending in a first direction (longitudinal direction) which is the direction of signal transmission. The signal conductor 40 is provided inside the base material 110 having a flat shape, which similarly has an elongated shape extending in the first direction. The signal conductor 40 is provided at a predetermined position along the thickness direction of the base material 110. The flat film surface of the signal conductor 40 and the flat plate surface of the base material 110 are parallel or substantially parallel to each other.

The first ground conductor 20 is located on a first flat plate surface. The first flat plate surface is one flat plate surface of the base material 110 which is parallel or substantially parallel to the flat film surface of the signal conductor 40. The first ground conductor 20 is arranged over the entire first flat plate surface. In other words, the first ground conductor 20 is a so-called solid conductor. Therefore, the first ground conductor 20 has an elongated shape extending in the first direction. The first ground conductor 20 is disposed at a predetermined spacing along the thickness direction of the base material 110 from the signal conductor 40.

The second ground conductor 30 is located on a second flat plate surface of the base material 110 opposite to the first flat plate surface. Consequently, the signal conductor 40 is sandwiched by the first ground conductor 20 and the second ground conductor 30 with the base material 110 therebetween. Therefore, the flat cable 10 defines a radio frequency line with a so-called triplate structure.

The second ground conductor 30 includes elongated conductors 31 and 32 and a plurality of bridge conductors 33 (331 and 332). The elongated conductors 31 and 32 have an elongated shape extending along the first direction. The elongated conductors 31 and 32 are disposed at a predetermined spacing in a second direction (width direction) that is perpendicular or substantially perpendicular to the first direction and the thickness direction. That is, the elongated conductors 31 and 32 are shaped to extend along the first direction, and are disposed in parallel or substantially parallel to each other at a predetermined spacing. The elongated conductors 31 and 32 are disposed so that, as viewed in a direction perpendicular or substantially perpendicular to their flat film surfaces, in other words, as viewed along the thickness direction, the elongated conductors 31 and 32 sandwich the signal conductor 40 without overlapping the signal conductor 40.

The bridge conductors 33 are shaped to extend along the second direction. The plurality of bridge conductors 33 connect the elongated conductor 31 and the elongated conductor 32 at a plurality of positions along the first direction.

More specifically, as illustrated in FIG. 2, bridge conductors 331, 332, 333, and 334 are disposed along the first direction, at predetermined spacings in the order of the bridge conductor 334, the bridge conductor 332, the bridge conductor 331, and the bridge conductor 333. The bridge conductors 331, 332, 333, and 334 connect the elongated conductor 31 and the elongated conductor 32 at their respective positions. With this configuration, an opening 341 is defined between the bridge conductor 331 and the bridge conductor 332. An opening 342 is also defined between the bridge conductor 332 and the bridge conductor 334. An opening 343 is also defined between the bridge conductor 331 and the bridge conductor 333. With this configuration, in an area that overlaps the signal conductor 40 along the thickness direction, the second ground conductor 30 has a ladder-shaped structure in which bridge conductors and openings appear alternately along the first direction. While FIGS. 1 and 2 illustrate only a portion of the ladder-shape structure, this ladder-shape structure is continuously arranged along the first direction.

The first ground conductor 20 and the second ground conductor 30, which are disposed so as to sandwich the base material 110 including the signal conductor 40, are connected by a plurality of via-hole conductors 50 (511 to 514, 521 to 524, and the like) provided in the base material 110.

Hereinafter, a specific structure of the plurality of via-hole conductors 50 (511 to 514, and 521 to 524) will be described in more detail. Since the structure of via-hole conductors 531 to 534, and 541 to 544 is determined in accordance with the same concept as that for the via-hole conductors 511 to 514, and 521 to 524, further description of the structure is omitted.

In plan view (as viewed along the thickness direction) of the flat cable 10, the via-hole conductors 511, 512, 513, and 514 are disposed near the bridge conductor 331.

More specifically, the via-hole conductor 511 is disposed in an area located on the elongated conductor 31 side, at a position where the bridge conductor 331 and the elongated conductor 31 connect with each other. In this regard, the via-hole conductor 511 is disposed at a predetermined position on the opening 341 side with respect to the corner portion where the bridge conductor 331 and the elongated conductor 31 intersect each other along the first direction.

In this regard, the via-hole conductor 511 is disposed at a position such that an end portion of the via-hole conductor 511 which is located on the bridge conductor 331 side along the first direction substantially coincides with the above-mentioned corner portion along the first direction. Further, the via-hole conductor 511 is preferably located in the vicinity of or adjacent to an edge on the opening 341 side of the elongated conductor 31.

The via-hole conductor 513 is disposed in an area located on the elongated conductor 31 side, at a position where the bridge conductor 331 and the elongated conductor 31 connect with each other. In this regard, the via-hole conductor 513 is disposed at a predetermined position on the opening 343 side with respect to the corner portion where the bridge conductor 331 and the elongated conductor 31 intersect each other along the first direction.

In this regard, the via-hole conductor 513 is disposed at such a position that an end portion of the via-hole conductor 513 which is located on the bridge conductor 331 side along the first direction substantially coincides with the above-mentioned corner portion along the first direction. Further, the via-hole conductor 513 is preferably located in the vicinity of or adjacent to an edge on the opening 343 side of the elongated conductor 31.

The via-hole conductor 511 configured in this way corresponds to "first interlayer connection conductor", and the via-hole conductor 513 corresponds to "second interlayer connection conductor".

The via-hole conductor 511 and the via-hole conductor 513 are preferably disposed in line symmetry with respect to a center line 800 of the bridge conductor 331. This allows for easy design of the via-hole conductor 511 and the via-hole conductor 513.

The via-hole conductor 512 is disposed in an area located on the elongated conductor 32 side, at a position where the bridge conductor 331 and the elongated conductor 32 connect with each other. In this regard, the via-hole conductor 512 is disposed at a predetermined position on the opening 341 side with respect to the corner portion where the bridge conductor 331 and the elongated conductor 32 intersect each other along the first direction.

In this regard, the via-hole conductor 512 is disposed at such a position that an end portion of the via-hole conductor 512 which is located on the bridge conductor 331 side along the first direction substantially coincides with the above-mentioned corner portion along the first direction. Further, the via-hole conductor 512 is preferably located in the vicinity of or adjacent to an edge on the opening 341 side of the elongated conductor 32.

The via-hole conductor 514 is disposed in an area located on the elongated conductor 32 side, at a position where the bridge conductor 331 and the elongated conductor 32 connect with each other. In this regard, the via-hole conductor 514 is disposed at a predetermined position on the opening 343 side with respect to the corner portion where the bridge conductor 331 and the elongated conductor 32 intersect each other along the first direction.

In this regard, the via-hole conductor 514 is disposed at such a position that an end portion of the via-hole conductor 514 which is located on the bridge conductor 331 side along the first direction substantially coincides with the above-mentioned corner portion along the first direction. Further, the via-hole conductor 514 is preferably located in the vicinity of or adjacent to an edge on the opening 343 side of the elongated conductor 32.

The via-hole conductor 512 configured in this way corresponds to "first interlayer connection conductor", and the via-hole conductor 514 corresponds to "second interlayer connection conductor".

The via-hole conductor 512 and the via-hole conductor 514 are also preferably disposed in line symmetry with respect to the center line 800 of the bridge conductor 331. This allows for easy design of the via-hole conductor 512 and the via-hole conductor 514.

In plan view of the flat cable 10, the via-hole conductors 521, 522, 523, and 524 are disposed near the bridge conductor 332.

More specifically, the via-hole conductor 521 is disposed in an area located on the elongated conductor 31 side, at a position where the bridge conductor 332 and the elongated conductor 31 connect with each other. In this regard, the via-hole conductor 521 is disposed at a predetermined position on the opening 342 side with respect to the corner portion where the bridge conductor 332 and the elongated conductor 31 intersect each other along the first direction.

In this regard, the via-hole conductor 521 is disposed at a position such that an end portion of the via-hole conductor 521 which is located on the bridge conductor 332 side along the first direction substantially coincides with the above-mentioned corner portion along the first direction. Further, the via-hole conductor 521 is preferably located in the vicinity of or adjacent to an edge on the opening 342 side of the elongated conductor 31.

The via-hole conductor 523 is disposed in an area located on the elongated conductor 31 side, at a position where the bridge conductor 332 and the elongated conductor 31 connect with each other. In this regard, the via-hole conductor 523 is disposed at a predetermined position on the opening 341 side with respect to the corner portion where the bridge conductor 332 and the elongated conductor 31 intersect each other along the first direction.

In this regard, the via-hole conductor 523 is disposed at a position such that an end portion of the via-hole conductor 523 which is located on the bridge conductor 332 side along the first direction substantially coincides with the above-mentioned corner portion along the first direction. Further, the via-hole conductor 523 is preferably located in the vicinity of or adjacent to an edge on the opening 341 side of the elongated conductor 31.

The via-hole conductor 521 configured in this way corresponds to "first interlayer connection conductor", and the via-hole conductor 523 corresponds to "second interlayer connection conductor".

The via-hole conductor 521 and the via-hole conductor 523 are preferably disposed in line symmetry with respect to the center line of the bridge conductor 332.

The via-hole conductor 522 is disposed in an area located on the elongated conductor 32 side, at a position where the bridge conductor 332 and the elongated conductor 32 connect with each other. In this regard, the via-hole conductor 522 is disposed at a predetermined position on the opening 342 side with respect to the corner portion where the bridge conductor 332 and the elongated conductor 32 intersect each other along the first direction.

In this regard, the via-hole conductor 522 is disposed at such a position that an end portion of the via-hole conductor 522 which is located on the bridge conductor 332 side along the first direction substantially coincides with the above-mentioned corner portion along the first direction. Further, the via-hole conductor 522 is preferably located in the vicinity of or adjacent to an edge on the opening 342 side of the elongated conductor 32.

The via-hole conductor 524 is disposed in an area located on the elongated conductor 32 side, at a position where the bridge conductor 332 and the elongated conductor 32 connect with each other. In this regard, the via-hole conductor 524 is disposed at a predetermined position on the opening 341 side with respect to the corner portion where the bridge conductor 332 and the elongated conductor 32 intersect each other along the first direction.

In this regard, the via-hole conductor 524 is disposed at a position such that an end portion of the via-hole conductor 524 which is located on the bridge conductor 332 side along the first direction substantially coincides with the above-mentioned corner portion along the first direction. Further, the via-hole conductor 524 is preferably located in the vicinity of or adjacent to an edge on the opening 341 side of the elongated conductor 32.

The via-hole conductor 522 configured in this way corresponds to "first interlayer connection conductor", and the via-hole conductor 524 corresponds to "second interlayer connection conductor".

The via-hole conductor 522 and the via-hole conductor 524 are also preferably disposed in line symmetry with respect to the center line of the bridge conductor 331.

A protective layer 120 with an insulating property is disposed on the surface on the first ground conductor 20 side of the base material 110. A protective layer 130 with an insulating property is disposed on the surface on the second ground conductor 30 side of the base material 110. The protective layers 120 and 130 are also preferably made of a material having flexibility.

In the flat cable 10 according to this preferred embodiment configured as mentioned above, countercurrents flow as described below to thus significantly reduce or prevent deterioration of the transmission characteristics of the radio frequency line. FIG. 4 illustrates transmission paths of countercurrents in the flat cable 10 according to the first preferred embodiment of the present invention.

In the flat cable 10, it is the portion of the bridge conductors 33 (331 and 332) where the second ground conductor 30 and the signal conductor 40 are opposed to each other. Therefore, when transmission of a radio frequency signal causes a current 900 to flow through the signal conductor 40, countercurrents 911, 912, 921, and 922 flowing in a direction opposite to the current 900 along the first direction are generated, with the bridge conductors 331 and 332 defining and serving as countercurrent generation points 901 and 902, respectively.

The countercurrent 911 flows from the bridge conductor 331 to the elongated conductor 31, with the countercurrent generation point 901 of the bridge conductor 331 as a starting point.

The countercurrent 911 flows to the first ground conductor 20 via the via-hole conductor 511 located in close proximity to the bridge conductor 331. The countercurrent 911 is also transmitted through an area 311 of the elongated conductor 31 which is located between the bridge conductors 331 and 332, and transmitted to the via-hole conductor 523 disposed on the area 311 side with respect to the bridge conductor 332. The countercurrent 911 flows to the first ground conductor 20 via the via-hole conductor 523. Meanwhile, the countercurrent 911 hardly flows toward the bridge conductor 332, and is not transmitted to the via-hole conductor 521.

The countercurrent 921 flows from the bridge conductor 332 to the elongated conductor 31, with the countercurrent generation point 902 of the bridge conductor 332 as a starting point.

The countercurrent 921 flows to the first ground conductor 20 via the via-hole conductor 521 located in close proximity to the bridge conductor 332. The countercurrent 921 is also guided to the first ground conductor 20 via an area 312 of the elongated conductor 31 which is located between the bridge conductor 332 and another bridge conductor, and a via-hole conductor located in close proximity to the other bridge conductor. Meanwhile, because the countercurrent 921 is a current that flows in a direction opposite to the current 900 along the first direction, the countercurrent 921 does not flow to the via-hole conductor 523 located on the opening 341 side, even though the via-hole conductor 523 is located in close proximity to the bridge conductor 332.

As described above, in the flat cable 10, the countercurrent 911 generated from the countercurrent generation point 901 flows to the first ground conductor 20 through the via-hole conductors 511 and 523, and the countercurrent 921 generated from the countercurrent generation point 902 flows to the first ground conductor 20 through the via-hole conductor 521 and, further, another via-hole conductor located on the opening 342 side. Therefore, the countercurrents 911 and 921 generated from different countercurrent generation points 901 and 902 do not concentrate.

Although not described in detail, likewise, no current concentration occurs for other via-hole conductors provided to the elongated conductor 31, as represented by the fact that as illustrated in FIG. 4, for example, a countercurrent 931 flowing from an area 313 on the opening 343 side of the elongated conductor 31 flows to the via-hole conductor 513 and does not flow to the via-hole conductor 511 through which the countercurrent 911 flows.

The countercurrent 912 flows from the bridge conductor 331 to the elongated conductor 32, with the countercurrent generation point 901 of the bridge conductor 331 as a starting point.

The countercurrent 912 flows to the first ground conductor 20 through the via-hole conductor 512 located in close proximity to the bridge conductor 331. The countercurrent 912 is also transmitted through an area 321 of the elongated conductor 32 which is located between the bridge conductors 331 and 332, and transmitted to the via-hole conductor 524 disposed on the area 311 side with respect to the bridge conductor 332. The countercurrent 912 flows to the first ground conductor 20 through the via-hole conductor 524. Meanwhile, the countercurrent 912 hardly flows toward the bridge conductor 332, and is not transmitted to the via-hole conductor 522.

The countercurrent 922 flows from the bridge conductor 332 to the elongated conductor 32, with the countercurrent generation point 902 of the bridge conductor 332 as a starting point.

The countercurrent 922 flows to the first ground conductor 20 through the via-hole conductor 522 located in close proximity to the bridge conductor 332. The countercurrent 922 is also guided to the first ground conductor 20 through an area 322 of the elongated conductor 32 which is located between the bridge conductor 332 and another bridge conductor, and a via-hole conductor located in close proximity to the other bridge conductor. Meanwhile, because the countercurrent 922 is a current that flows in a direction opposite to the current 900 along the first direction, the countercurrent 922 does not flow to the via-hole conductor 524 located on the opening 341 side, even though the via-hole conductor 524 is located in close proximity to the bridge conductor 332.

As described above, in the flat cable 10, the countercurrent 912 generated from the countercurrent generation point 901 flows to the first ground conductor 20 via the via-hole conductors 512 and 524, and the countercurrent 922 generated from the countercurrent generation point 902 flows to the first ground conductor 20 via the via-hole conductor 522 and, further, another via-hole conductor located on the opening 342 side. Therefore, the countercurrents 912 and 922 generated from different countercurrent generation points 901 and 902, respectively, do not concentrate. As compared with bridge conductors, via-hole conductors have high resistivity and do not readily allow current to flow through. If currents flowing through bridge conductors concentrate on a via-hole conductor, the resistance encountered when countercurrents flow becomes high, which increases the transmission loss of the transmission line as a whole. However, by preventing currents from concentrating on a via-hole conductor as described above in this preferred embodiment, the transmission loss of the transmission line as a whole is reduced.

Although not described in detail, likewise, no current concentration occurs for other via-hole conductors provided to the elongated conductor 32, as represented by the fact that as illustrated in FIG. 4, for example, a countercurrent 932 flowing from an area 323 on the opening 343 side of the elongated conductor 32 flows to the via-hole conductor 514 and does not flow to the via-hole conductor 512 through which the countercurrent 911 flows.

As described above, in the flat cable 10 according to this preferred embodiment, countercurrents generated in the second ground conductor 30 do not concentrate on a via-hole conductor. Consequently, current density does not become high in the vicinity of the via-hole conductor, thus significantly reducing or preventing localized increase in resistance in the vicinity of the via-hole conductor. As a result, the second ground conductor 30 and the first ground conductor 20 preferably are set at the same potential, thus significantly reducing or preventing occurrence of unwanted resonance. Therefore, the flat cable 10 achieves excellent transmission characteristics as a radio frequency line.

As described above, each of the via-hole conductors is preferably located near or adjacent to the edge of the opening of each of the elongated conductors 31 and 32. Thus, each via-hole conductor is disposed on a path through which the main flow of countercurrent flows. Therefore, countercurrents are effectively passed to the first ground conductor 20.

The flat cable 10 having the above-mentioned structure can be used for a connector cable 60 described below. FIG. 5A is an exterior perspective view of a connector cable according to the first preferred embodiment of the present invention. FIG. 5B is a cross-sectional view of this connector cable.

The connector cable 60 includes the flat cable 10 and a coaxial connector 61. The coaxial connector 61 is disposed at either longitudinal end of the flat cable 10. The coaxial connector 61 is preferably provided on the surface of the protective layer 120 on the first ground conductor 20 side of the flat cable 10. A signal conductor 601 of the coaxial connector 61 is connected to the signal conductor 40 of the flat cable 10. The flat cable 10 includes a converter ground conductor 35 located on the second ground conductor 30 side in the connecting area of the signal conductor 601 and the signal conductor 40.

The above-mentioned configuration makes it possible to realize a connector cable that is thin and has flexibility, and exhibits excellent transmission characteristics as a radio frequency line.

Figure 6B:
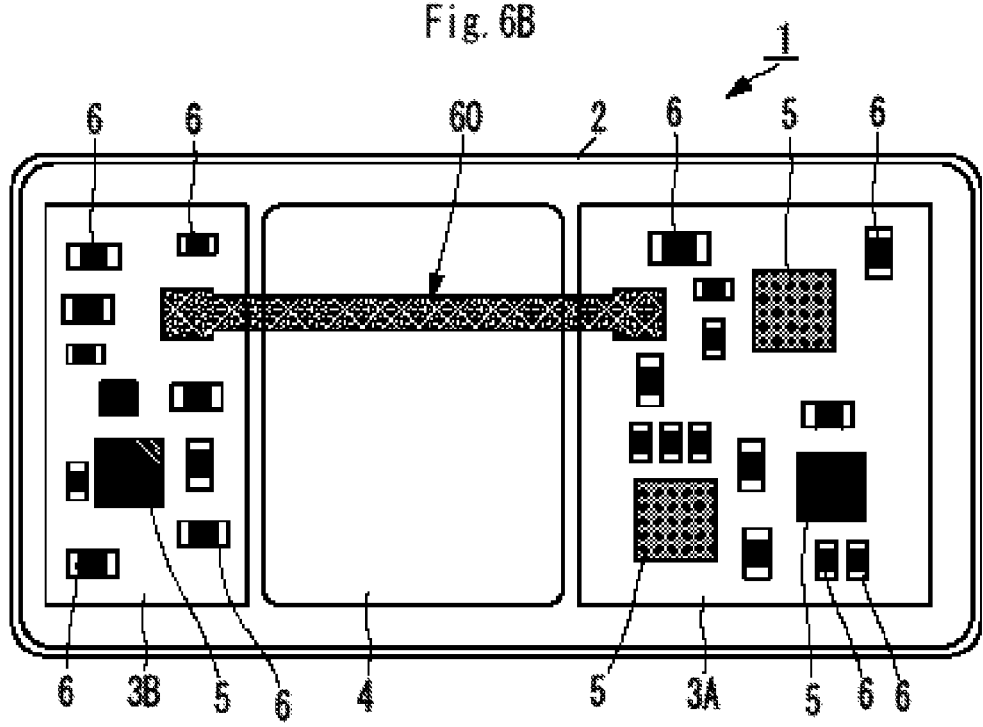

Further, the connector cable 60 having the above-mentioned structure can be used for a portable electronic device as described below. FIG. 6A is a side cross-sectional view illustrating a configuration of the components of a portable electronic device according to the first preferred embodiment of the present invention. FIG. 6B is a plan cross-sectional view for explaining the configuration of the components of the portable electronic device.

A portable electronic device 1 includes a thin device housing 2. Mounting circuit boards 3A and 3B, and a battery pack 4 are disposed inside the device housing 2. A plurality of IC chips 5 and mounting components 6 are mounted on the surfaces of the mounting circuit boards 3A and 3B. The mounting circuit boards 3A and 3B and the battery pack 4 are provided in the device housing 2 so that, in plan view of the device housing 2, the battery pack 4 is disposed between the mounting circuit boards 3A and 3B. Because the device housing 2 is made as thin as possible, the space between the battery pack 4 and the device housing 2 is very narrow in the thickness direction of the device housing 2. Therefore, the coaxial cable cannot be disposed in this space.

However, by disposing the connector cable 60 according to this preferred embodiment so that the thickness direction of the connector cable 60 coincides with the thickness direction of the device housing 2, the connector cable 60 can be passed between the battery pack 4 and the device housing 2. As a result, the mounting circuit boards 3A and 3B that are spaced apart from each other with the battery pack 4 therebetween are connected by the connector cable 60.

Figure 7:
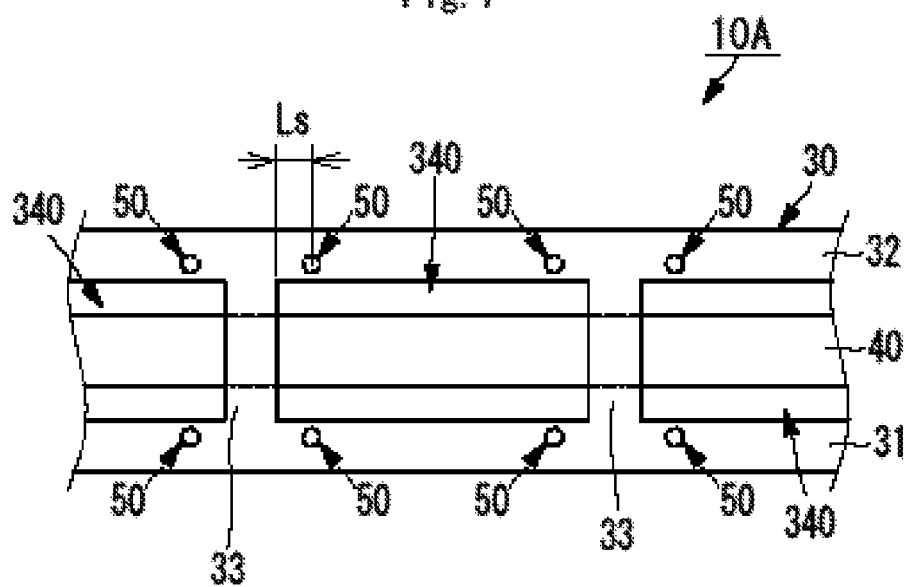
FIG. 7 is a plan view of a flat cable according to a second preferred embodiment of the present invention.

Next, a flat cable according to a second preferred embodiment of the present invention will be described with reference to a figure. FIG. 7 is a plan view of the flat cable according to the second preferred embodiment of the present invention. A flat cable 10A according to this preferred embodiment differs from the flat cable 10 according to the first preferred embodiment in the positions where the via-hole conductors 50 are located. Otherwise, the flat cable 10A is configured preferably in the same manner as the flat cable 10 according to the first preferred embodiment.

The via-hole conductors 50 of the flat cable 10A according to this preferred embodiment are located at a distance Ls closer to the center of the opening 340 with respect to the bridge conductor 33 along the first direction, than are the via-hole conductors of the flat cable 10 according to the first preferred embodiment. This configuration also provides the same operational effects and advantages as that of the first preferred embodiment.

Figure 8:
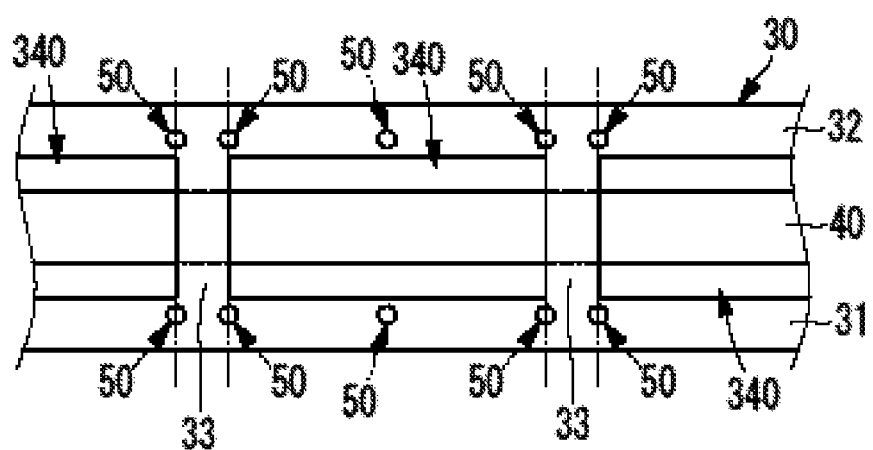
FIG. 8 is a plan view of a flat cable according to a third preferred embodiment of the present invention.

Next, a flat cable according to a third preferred embodiment of the present invention will be described with reference to a figure. FIG. 8 is a plan view of the flat cable according to the third preferred embodiment of the present invention. A flat cable 10B according to this preferred embodiment differs from the flat cable 10 according to the first preferred embodiment in the positions where the via-hole conductors 50 are located. Otherwise, the flat cable 10B is configured preferably in the same manner as the flat cable 10 according to the first preferred embodiment.

Each of the via-hole conductors 50 of the flat cable 10B according to this preferred embodiment is disposed at a position that coincides with the corner portion where the elongated conductor 31 or 32 and each of the bridge conductors 33 connect with each other, along the first direction. This configuration makes it possible to reinforce the strength of corner portions between the elongated conductors 31 and 32 and the bridge conductors 33 where stress tends to be exerted when the flat cable 10B is bent. As a result, a flat cable that is more resistant against breakage is realized while maintaining the excellent transmission characteristics mentioned above.

In addition, in the flat cable 10B according to this preferred embodiment, the via-hole conductors 50 are disposed in a portion of each of the elongated conductors 31 and 32 which is located in the vicinity of or adjacent to the central portion of the opening 340 along the first direction. Disposing the via-hole conductors 50 also at such a position makes it possible to realize a flat cable that is further resistant against breakage.

Figure 9:
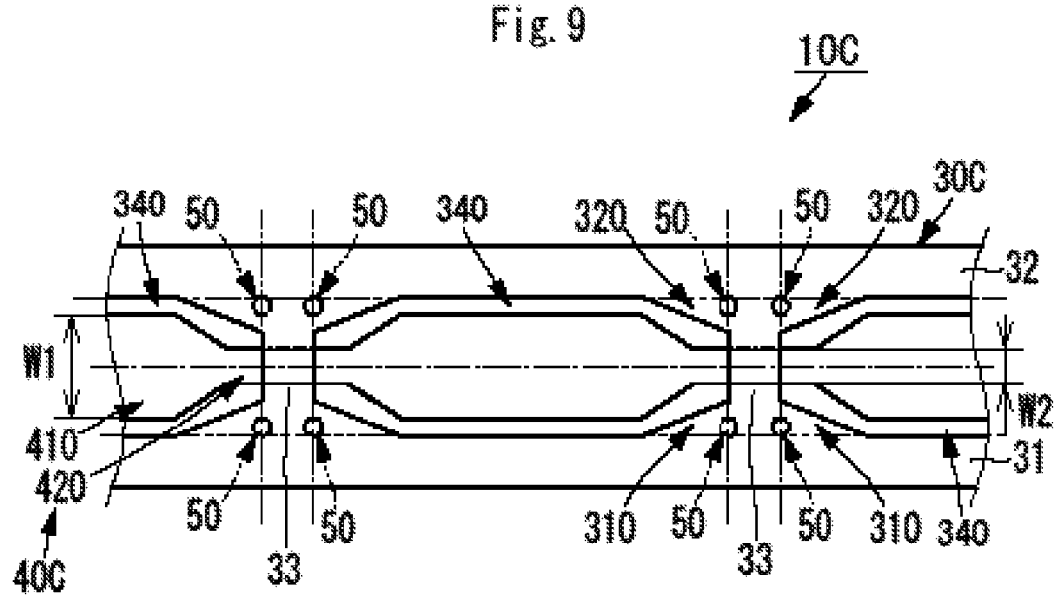
FIG. 9 is a plan view of a flat cable according to a fourth preferred embodiment of the present invention.

Next, a flat cable according to a fourth preferred embodiment of the present invention will be described with reference to a figure. FIG. 9 is a plan view of the flat cable according to the fourth preferred embodiment of the present invention. A flat cable 10C according to this preferred embodiment differs from the flat cable 10B according to the third preferred embodiment in the structure of a signal conductor 40C and the structure of a second ground conductor 30C and, in accordance with these changes in structure, further differs in the positions at which the via-hole conductors 50 are disposed. Otherwise, the flat cable 10C is configured preferably in the same manner as the flat cable 10B according to the third preferred embodiment.

The signal conductor 40C of the flat cable 10C has a small width (W2) in a second area 420, and has a large width (W1>W2) in a first area 410. The second area 420 includes an area overlapping each of the bridge conductors 33 in plan view, and a predetermined area including the overlapping area along the first direction. The first area 410 is an area other than the second area 420. That is, the signal conductor 40C is as wide as possible, except for the second area 420 that overlaps the bridge conductors 33. This configuration lowers the radio frequency resistance of the signal conductor 40C, thus reducing transmission loss.

In addition, the varying width portion of the signal conductor 40C has a tapered configuration with gradually varying width. As a result, discontinuity of impedance in the varying portion is prevented, thus reducing transmission loss.

The second ground conductor 30C of the flat cable 10C is configured so as to increase in width with increasing proximity to the connecting area with each of the bridge conductors 33. In this regard, the elongated conductors 31 and constituting the second ground conductor 30C are provided with extended portions 310 and 320, respectively, so that the elongated conductors 31 and 32 lie closer to each other with increasing proximity to the connecting area with each of the bridge conductors 33.

Each of the via-hole conductors 50 is configured so as to at least partially lie within the extended portion 310 or 320. By providing each of the via-hole conductors 50 at such a position, the via-hole conductor 50 is disposed on a path along which the main flow of countercurrent flows, thus effectively allowing countercurrent to flow to the first ground conductor 20.

Figure 10:
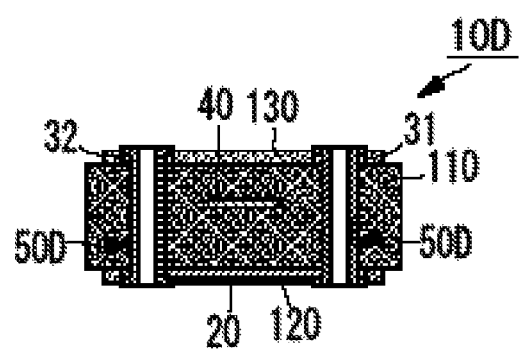
FIG. 10 is a cross-sectional view of a flat cable according to a fifth preferred embodiment of the present invention.

Next, a flat cable according to a fifth preferred embodiment of the present invention will be described with reference to a figure. FIG. 10 is a cross-sectional view of the flat cable according to the fifth preferred embodiment of the present invention.

A flat cable 10D according to this preferred embodiment includes conductive through-holes 50D each having a conductor film provided on the inner wall surface of a through-hole, instead of via-hole conductors filled with a conductive material. Otherwise, the flat cable 10D is configured preferably in the same manner as the flat cable 10 according to the first preferred embodiment.

Use of the conductive through-holes 50D as mentioned above also makes it possible to attain the same operation effect as that of the above preferred embodiments.

Figure 11:
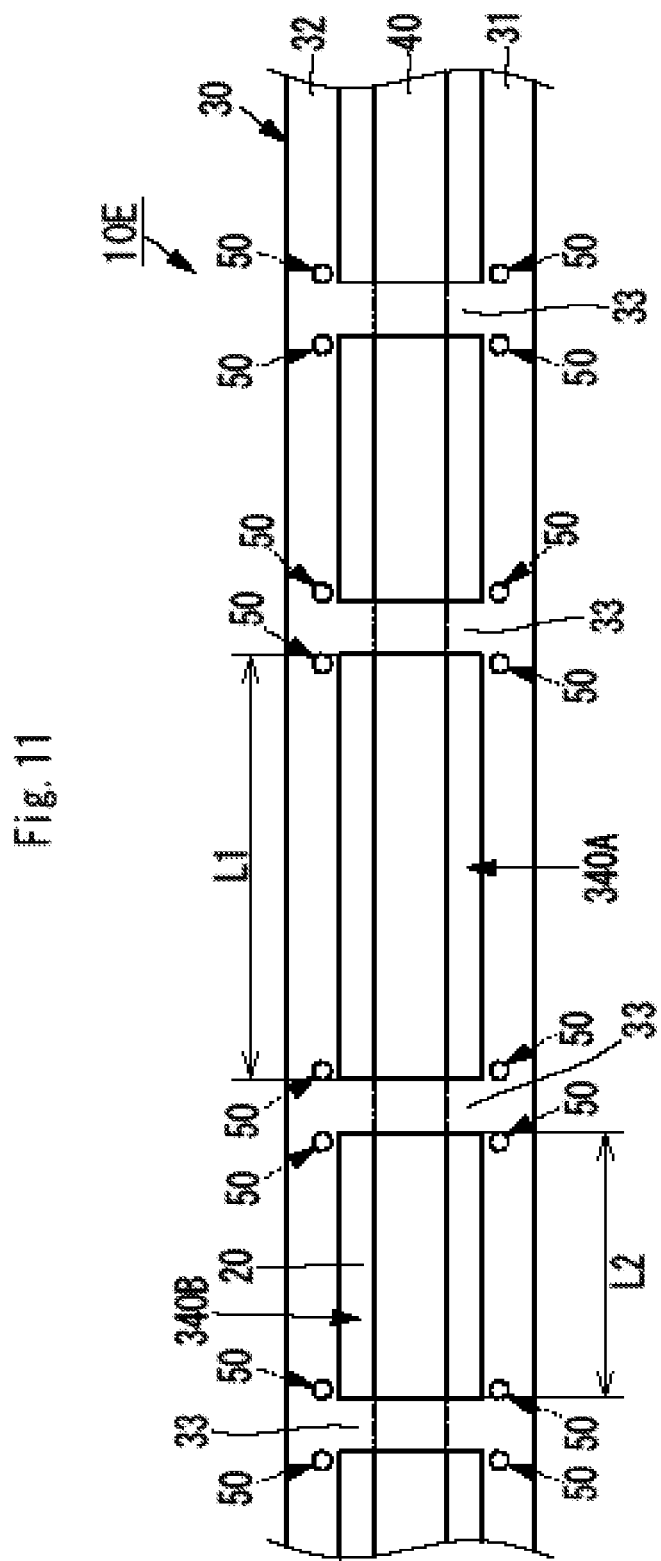
FIG. 11 is a plan view of a flat cable according to a sixth preferred embodiment of the present invention.

Next, a flat cable according to a sixth preferred embodiment of the present invention will be described with reference to a figure. FIG. 11 is a plan view of the flat cable according to the sixth preferred embodiment of the present invention.

In a flat cable 10E according to this preferred embodiment, the bridge conductors 33 are located not at regular spacings over the entire length of the flat cable 10E but at spacings that vary at least partially. Otherwise, the flat cable 10E is configured preferably in the same manner as the flat cable 10 according to the first preferred embodiment.

As illustrated in FIG. 11, in the flat cable 10E, for example, a spacing (length of an opening 340A along the first direction) L1 between given bridge conductors 33, and a spacing (length of an opening 340B along the first direction) L2 between other bridge conductors 33 differ from each other.

This configuration prevents matching of unwanted resonant frequencies determined by the spacing of the bridge conductors 33. As a result, even in the presence of unwanted resonance that cannot be completely suppressed, it is possible to prevent the level of the resonance from increasing to affect the transmission characteristics of the flat cable as a radio frequency line.

Figure 12:
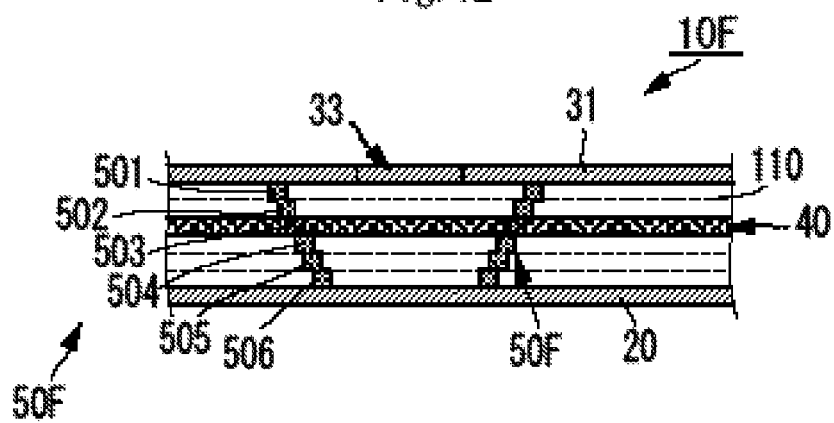
FIG. 12 is a cross-sectional view of a flat cable according to a seventh preferred embodiment of the present invention.
Figure 13:
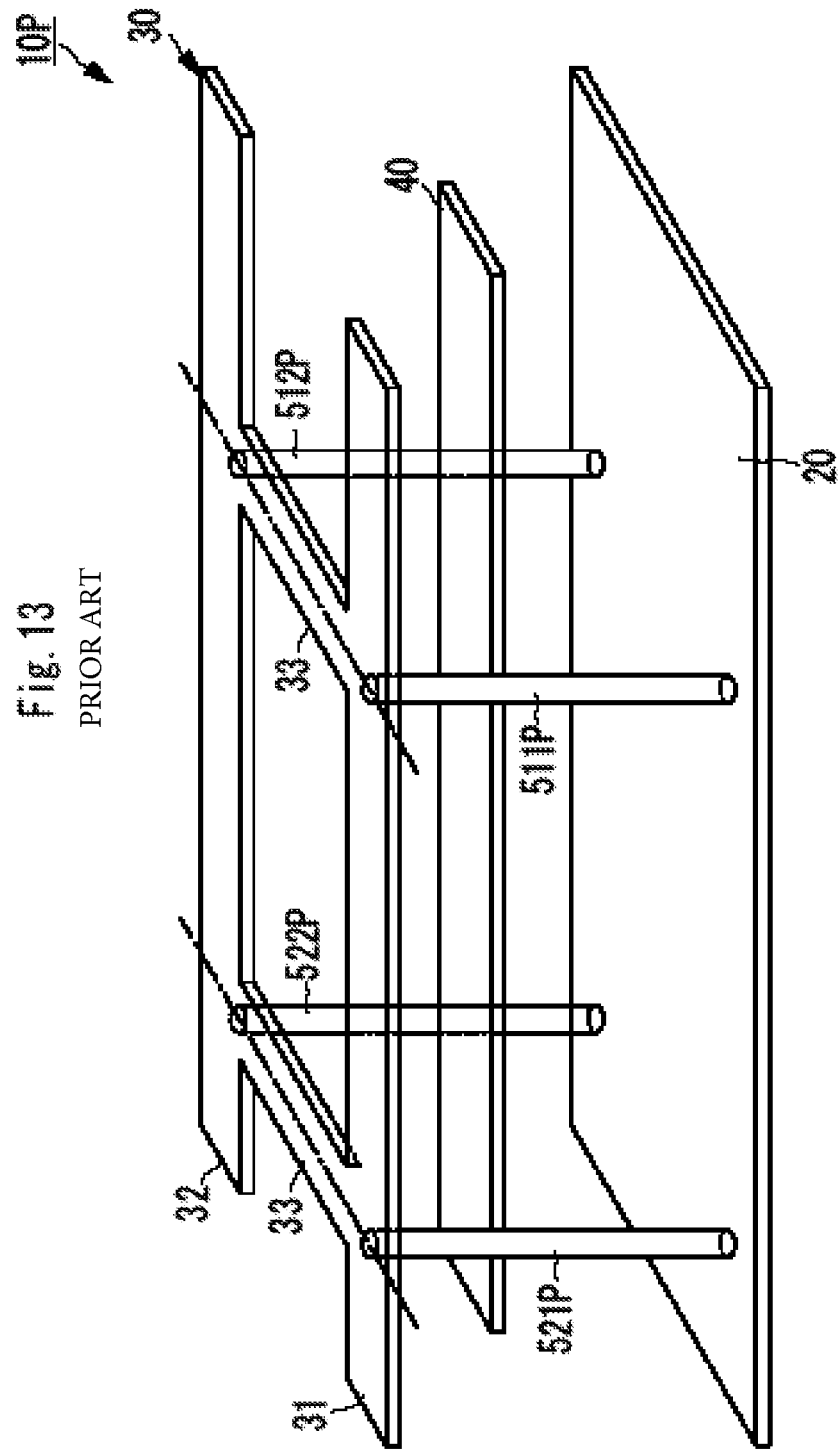
FIG. 13 is an exploded perspective view illustrating a structure of a flat cable discussed in International Publication No. WO 2011/007660.
Figure 14:
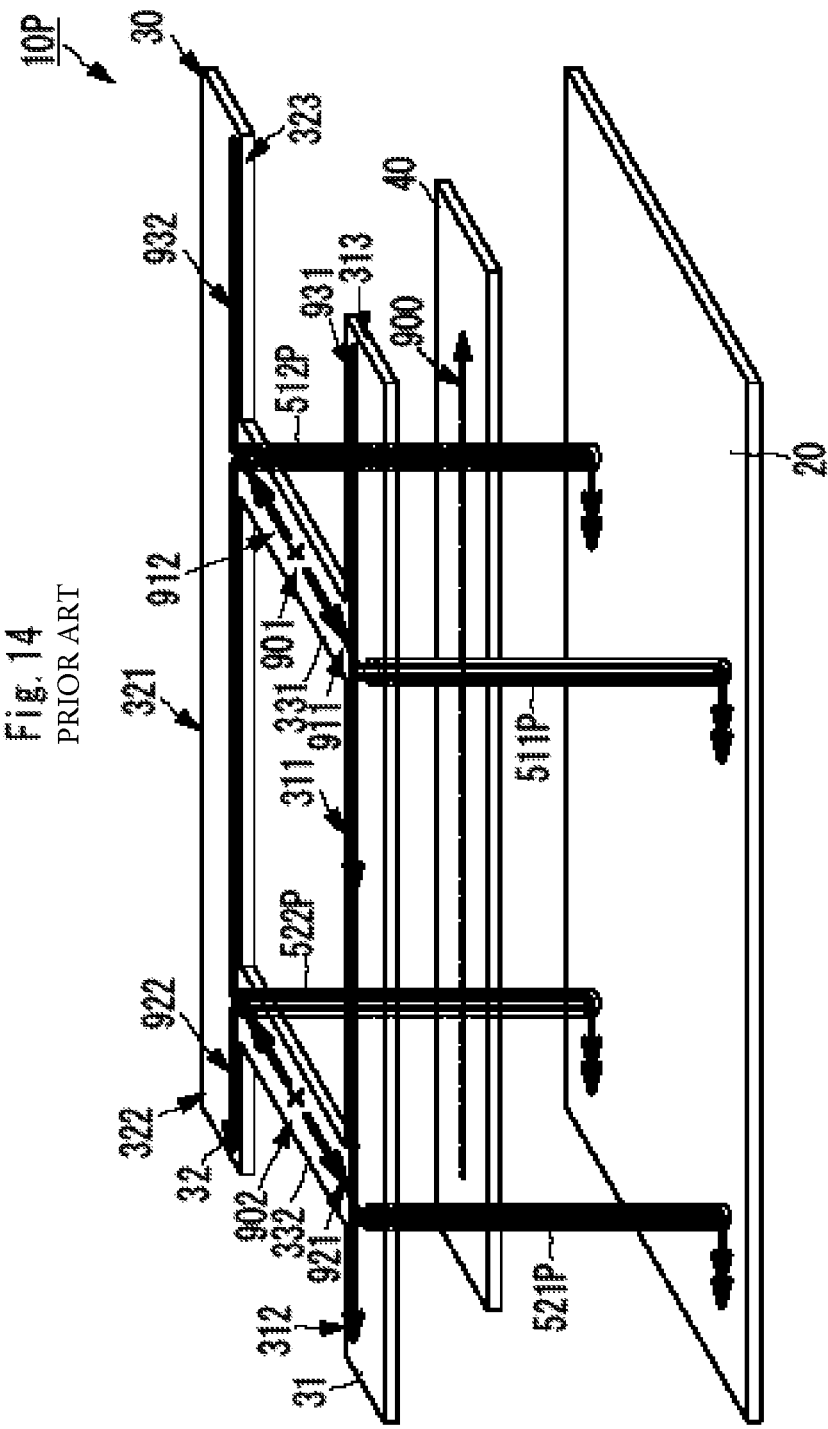
FIG. 14 is an exploded perspective view for explaining problems of a conventional flat cable 10P.

Next, a flat cable according to a seventh preferred embodiment of the present invention will be described with reference to a figure. FIG. 12 is a cross-sectional view of the flat cable according to the seventh preferred embodiment of the present invention.

In a flat cable 10F according to this preferred embodiment, the shape of via-hole conductors 50F differs from that of the via-hole conductors 50 according to the first preferred embodiment. Otherwise, the flat cable 10F is configured preferably in the same manner as the flat cable 10 according to the first preferred embodiment.

Each of the via-hole conductors 50F of the flat cable 10F is formed preferably by laminating a plurality of partial vias 501, 502, 503, 504, 505, and 506 that are sequentially shifted in center position along the thickness direction. In this regard, each of the partial vias 501 to 506 is configured so as not to overlap anything except an adjacent partial via(s) along the width direction in plan view. This configuration keeps the height of the via-hole conductor lower than a via-hole conductor shaped to extend in a straight line along the thickness direction. As a result, a thin flat cable with improved flatness is realized, without causing a localized increase in the thickness of the flat cable.

Further, the partial vias are preferably laminated in such a way that adjacent via-hole conductors are spaced apart from each other on the second ground conductor side and are close to each other on the first ground conductor side. This configuration keeps the via-hole conductors spaced apart on the second ground conductor, thus significantly reducing or preventing current concentration more effectively.

While the above preferred embodiments are directed to the case where the via-hole conductors are disposed so as to be symmetrical along the first direction with respect to each of the bridge conductors, for example, the via-hole conductors may not necessarily be disposed symmetrically. It suffices that the via-hole conductors be at least provided in two mutually opposite directions along the first direction with respect to a single bridge conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flat cable comprising:
a base material that has flexibility;
a signal conductor that is provided inside the base material and extends in a first direction,
a first ground conductor and a second ground conductor that extend along the signal conductor, the first ground conductor and the second ground conductor being disposed so as to sandwich the base material from both sides of a thickness direction of the base material; and
an interlayer connection conductor that is provided in the base material so as to connect the first ground conductor and the second ground conductor; wherein
the second ground conductor includes:
two elongated conductors that extend in parallel or substantially in parallel along the first direction at a spacing from each other; and
bridge conductors that connect the two elongated conductors at predetermined points along the first direction; wherein
the interlayer connection conductor includes a first interlayer connection conductor and a second interlayer connection conductor disposed so as to sandwich a connecting position of each of the elongated conductors with each of the bridge conductors along the first direction.

2. The flat cable according to claim 1, wherein the first interlayer connection conductor and the second interlayer connection conductor are disposed at symmetrical positions with respect to a center line of each of the bridge conductors which passes through the connecting position.

3. The flat cable according to claim 1, wherein each of the first interlayer connection conductor and the second interlayer connection conductor is located near or adjacent to a corner portion where each of the elongated conductors and each of the bridge conductors connect with each other.

4. The flat cable according to claim 1, wherein
the elongated conductors increase in width so that a distance between the elongated conductors becomes shorter with increasing proximity to a connecting position with each of the bridge conductors; and
each of the first interlayer connection conductor and the second interlayer connection conductor is at least partially located within a portion of increased width of each of the elongated conductors.

5. The flat cable according to claim 1, wherein the signal conductor has a larger width in an area that does not overlap each of the bridge conductors than in an area that overlaps each of the bridge conductors.

6. The flat cable according to claim 1, wherein the bridge conductors are spaced from each other at distances that vary at least partially along the first direction.

7. The flat cable according to claim 1, wherein the two elongated conductors sandwich the signal conductor without overlapping the signal conductor.

8. The flat cable according to claim 1, wherein openings are respectively provided between adjacent pairs of the bridge conductors.

9. The flat cable according to claim 8, wherein the second ground conductor has a ladder-shaped structure in which the bridge conductors and the openings alternate along the first direction.

10. The flat cable according to claim 1, wherein the first and second interlayer connection conductors include via hole conductors provided in the base material to connect the first ground conductor and the second ground conductor.

11. The flat cable according to claim 10, wherein openings are provided in the two elongated conductors and each of the via-hole conductors is located near or adjacent to an edge of one of the openings.

12. The flat cable according to claim 10, wherein each of the via-hole conductors is located near or adjacent to a corner portion where each of the elongated conductors and each of the bridge conductors connect with each other.

13. The flat cable according to claim 10, wherein each of the two elongated conductors includes an extended portion configured such that each of the via-hole conductors is located at least partially within the extended portion.

14. The flat cable according to claim 10, wherein each of the via-hole conductors includes a plurality of partial vias.

15. The flat cable according to claim 1, further comprising a first protective layer with an insulating property disposed between the base material and the first ground conductor and a second protective layer with an insulating property disposed between the base material and the second ground conductor.

16. The flat cable according to claim 1, wherein the signal conductor has a tapered configuration with a varying width.

17. The flat cable according to claim 1, wherein the second ground conductor increases in width with increasing proximity to a connection position with each of the bridge connectors.

18. The flat cable according to claim 1, wherein the first and second interlayer connection conductors include conductive through-holes including a conductive film provided on an inner wall surface thereof.

19. A connector cable comprising:
the flat cable according to claim 1; and
a coaxial connector located at an end of the flat cable.

20. An electronic device comprising the connector cable of claim 19.

* * * * *